RADIO FREQUENCY TUNER HAVING FINE TUNING MEANS

Filed April 5, 1955 3 Sheets-Sheet 1

Inventor
Louis E. Coutermash

Ooms, McDougall, Williams & Hersh
Attys.

Feb. 10, 1959 L. E. COUTERMASH 2,872,824

RADIO FREQUENCY TUNER HAVING FINE TUNING MEANS

Filed April 5, 1955 3 Sheets-Sheet 2

Inventor
Louis E. Coutermash

Ooms, McDougall, Williams & Hersh
Attys.

Feb. 10, 1959 L. E. COUTERMASH 2,872,824

RADIO FREQUENCY TUNER HAVING FINE TUNING MEANS

Filed April 5, 1955 3 Sheets-Sheet 3

Inventor
Louis E. Coutermash

Ooms, McDougall, Williams & Hersh
Attys.

2,872,824

RADIO FREQUENCY TUNER HAVING FINE TUNING MEANS

Louis E. Coutermash, Norwalk, Conn., assignor to Aladdin Industries, Incorporated, Nashville, Tenn., a corporation of Illinois Application April 5, 1955, Serial No. 499,269

10 Claims. (Cl. 74—10.6)

This invention relates to radio frequency tuners and particularly to fine tuning mechanisms for use with such tuners.

One principal object of the invention is to provide a new and improved fine tuning mechanism, for use with television or other high frequency tuners, adapted to effect fine tuning of the tuner by laterally shifting the main tuning shaft of the tuner.

A further object is to provide new and improved fine tuning mechanisms adapted to effect slight lateral shifting movement of a main tuning shaft which carries a plurality of cams or the like for operating laterally movable tuning members.

Another object is to provide fine tuning mechanisms which are effective and dependable in operation, yet are extremely simple and low in cost.

Further objects and advantages of the invention will appear from the following description, taken with the accompanying drawings, in which.

Figure 10:
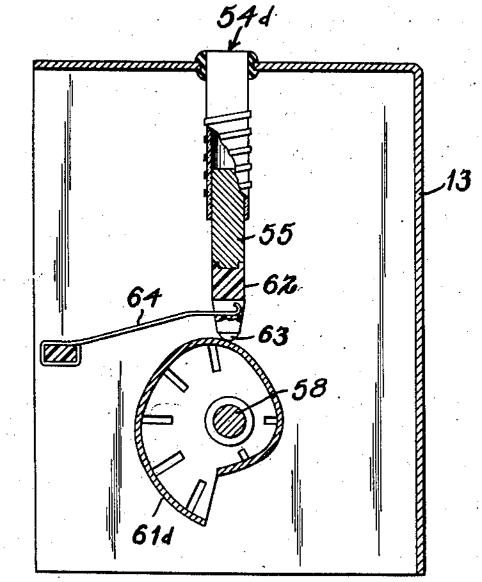
Figure 9:
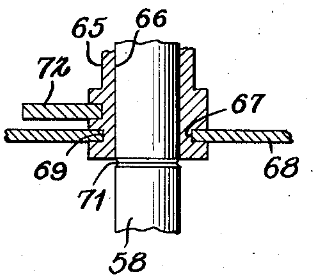
Figure 6:
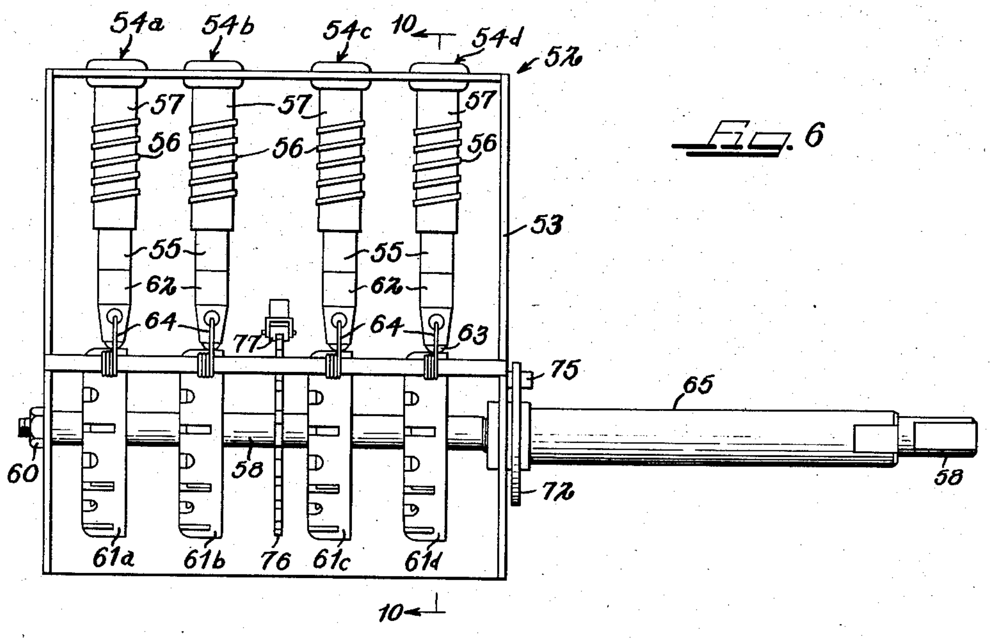
Figure 6 is a side elevational view of a modified tuner embodying the modified fine tuning mechanism.
Figure 7:
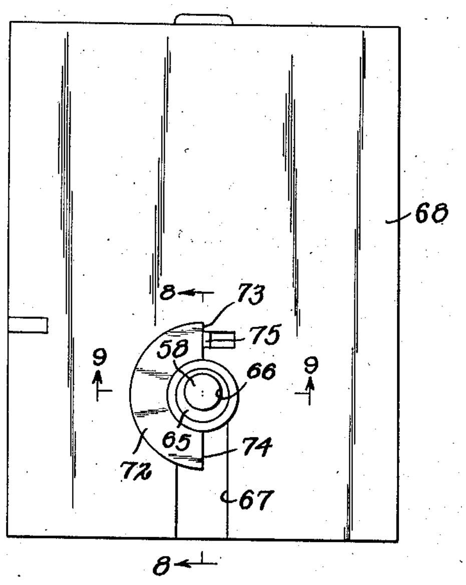
Figure 7 is a front elevational view of the modified tuner of Figure 6.
Figure 8:
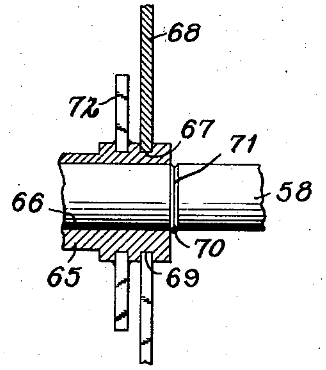

Figures 8 and 9 are fragmentary vertical and horizontal sectional views taken through the modified fine tuning mechanism, generally along lines 8—8 and 9—9 in Figure 7; and Figure 10 is an elevational sectional view taken generally along the line 10—10 in Figure 6.

Figure 1:
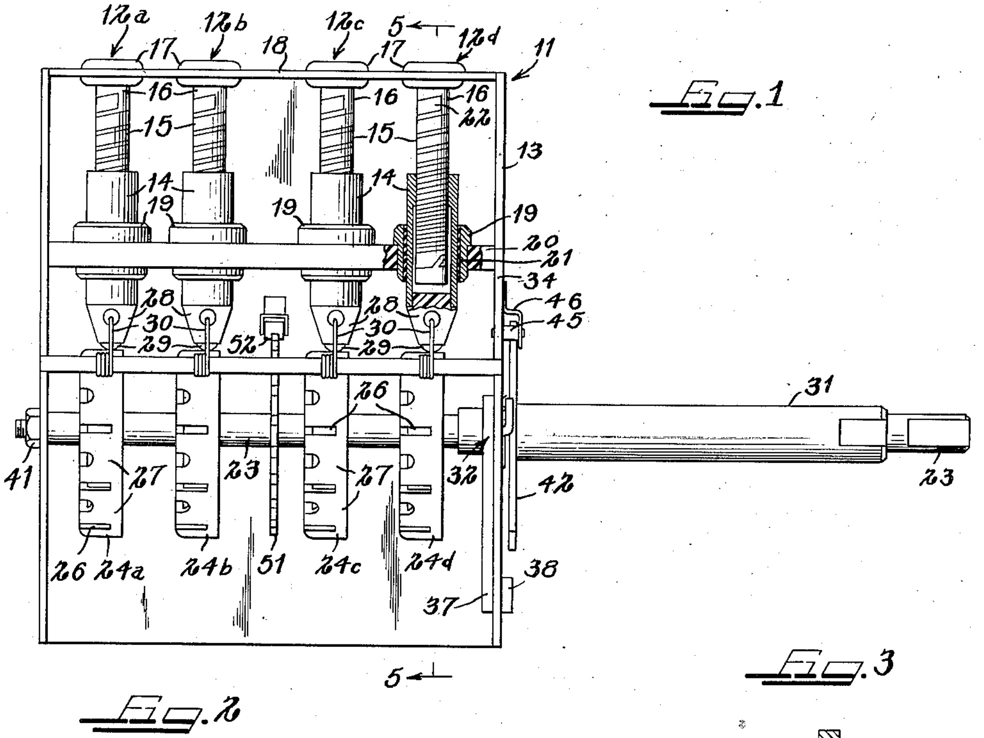
Figure 1 is a side elevational view of an exemplary tuner provided with a fine tuning mechanism constituting an illustrative embodiment of the invention.
Figure 2:
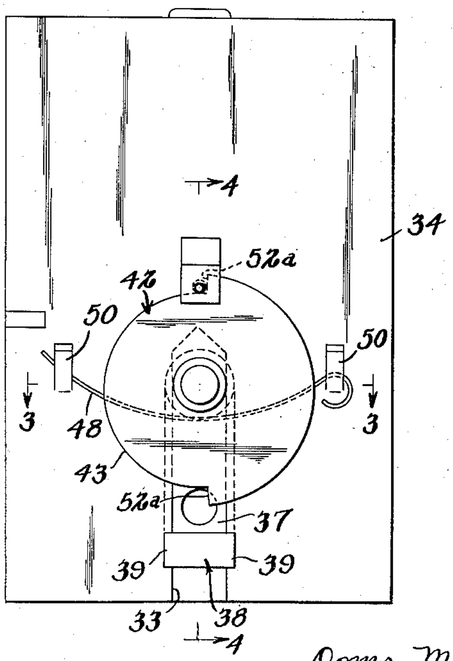
Figure 2 is a front elevational view of the tuner of Figure 1.
Figure 3:
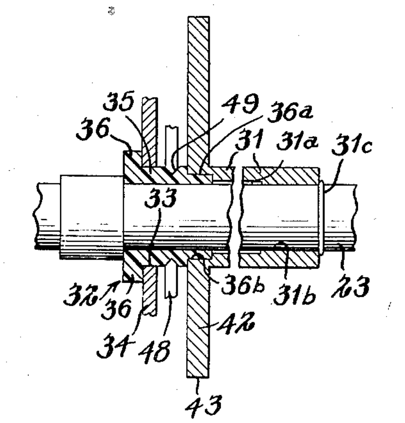
Figure 3 is a fragmentary horizontal sectional view taken through the fine tuning mechanism, generally along a line 3—3 of Figure 2.
Figure 4:
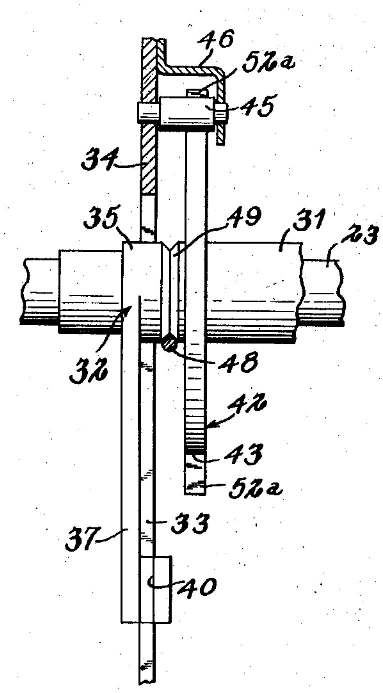
Figure 4 is a fragmentary vertical sectional view taken through the fine tuning mechanism, generally along a line 4—4 of Figure 2.
Figure 5:
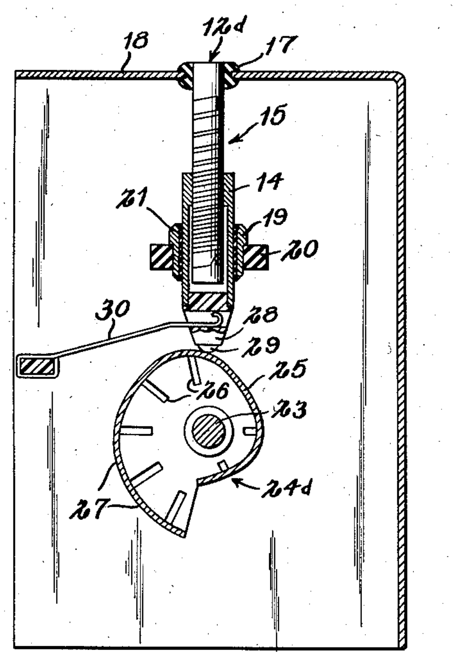
Figure 5 is an elevational sectional view taken generally along a line 5—5 of Figure 1.

If the drawings are considered in greater detail, it will be seen that Figure 1 illustrates a tuner 11 of the type adapted for use in television or other high frequency radio receivers or the like. The illustrated tuner 11 is of the superheterodyne type, and includes four variable tuning devices 12, the individual devices being designated 12*a*, 12*b*, 12*c*, and 12*d* in Figure 1 for identification. The four tuning devices may be essentially similar in construction, although they may differ in minor details to secure different tuning ranges and to allow for differences in the circuit components connected to the tuning devices. It will be seen that the tuning devices are mounted on and are spaced between the rear and the front of a sheet metal chassis or supporting frame 13.

Those skilled in the art will be familiar with the fact that the usual television tuner includes an antenna circuit for receiving signals from a television antenna, an amplifying stage for amplifying the received signals, an oscillator for generating a heterodyning signal, and a mixer stage for combining the amplified signal and the oscillator signal to produce an intermediate frequency signal. In the illustrated tuner 11, the rearmost tuning device 12*a* may be employed to resonate the antenna circuit. The tuning devices 12*b* and 12*c* may be interposed between the radio frequency amplifying stage and the mixer stage, and the tuning device 12*d* may be utilized in the oscillator circuit to determine the frequency of operation of the oscillator.

It will be seen that the tuning devices 12 are of the type having a movable tuning member adapted to be adjusted back and forth along a predetermined path. In itself, the construction of the tuning devices forms no part of the present invention. In fact, the illustrated tuning devices are of the type disclosed and claimed in the co-pending application of Harold T. Lyman, Serial No. 438,043, filed June 21, 1954, now Patent No. 2,832,891, for Wide Range Radio Frequency Tuner. Reference may be had to this application for a comprehensive description of the tuning devices. Briefly, however, each tuning device 12 comprises a reciprocable tuning member formed of a conductive metal sleeve 14. In this instance, the sleeve 14 is telescopically received over and is movable along a coil 15. If the sleeve 14 is moved back and forth, more or less of the coil 15 will be received within the sleeve and hence will be rendered ineffective. The coil 15 is preferably insulated so that the coupling between the sleeve 14 and the coil is capacitive in nature. It will be seen that the coil 15 is supported by an insulating coil form 16 which is mounted at one end in a rubber grommet 17 supported by a wall 18 of the chassis 13.

A circuit connection is made to the tuning sleeve 14 by means of a fixed coupling ring 19 which is received around the sleeve and is mounted in an insulating plate 20. The ring 19 is insulated from the sleeve 14 by means of an insulating coating 21 applied to the inside of the ring. Accordingly, the coupling between the ring 19 and the sleeve 14 is also of a capacitive nature. It will be understood that the ring 19 functions as one end terminal of the tuning device 12. The tuning device 12 has its other end terminal 22 at the end of the coil 15 remote from the ring 19.

It will be observed that the four coils 15 are parallel to one another and that the tuning sleeves 14 are movable along parallel linear paths spaced from front to rear in the chassis 13. In order to operate all of the linearly movable tuning members 14 simultaneously so as to adjust the tuner 11 to the various television channels, the tuner 11 is provided with a main tuning shaft 23, journaled in the chassis 13. Four cams 24*a*–24*d* are mounted on the shaft 23 to operate the tuning sleeves 14 of the respective tuning devices 12*a*–12*d*. It will be seen that the cams 24*a*–24*d* are spaced from rear to front along the tuning shaft 23. Each of the illustrated cams 24 is provided with a thin peripheral wall 25 formed with a plurality of longitudinal slots 26 which define adjustable tabs or peripheral segments 27. This cam construction forms no part of the present invention, but is disclosed and claimed in the co-pending application of Harold T. Lyman, Serial No. 457,661, filed September 22, 1954 for Driving Mechanism for Tuners. Each tab 27 represents a particular television channel which is selected by rotating the tuning shaft 23. By bending the tab 27 with a suitable tool, each of the tuning devices 12 may be tracked with the other devices at each channel.

In order that the cams 24 may actuate the tuning devices 12, each of the tuning sleeves 14 is provided with a cam follower in the form of an insulating member 28 secured to the end of the sleeve. A roller in the form of a ball bearing 29 is rotatably received in the end of the insulating member 28. A spring 30 biases the insulating cam follower member 28 in such a direction as to maintain the ball 29 in rolling engagement with the cam 24.

It will be understood that rotation of the tuning or channel-selecting shaft 23 is effective to rotate all of the cams **24*a*–24*d* simultaneously. As the cams are rotated, the tuning members 14 are moved back and forth along paths extending laterally of the shaft 23. In this way, the tuning devices 12*a*–12*d*** are shifted to their proper settings for the various television channels.

Provision is made in the tuner 11 for effecting a fine adjustment of the tuning devices **12*a*–12*d*, the arrangement being such that the tuning device 12*d***, employed in the oscillator circuit, is varied to a greater extent than the other tuning devices. In the usual television tuner, some provision is generally made for effecting a fine adjustment of the oscillator tuning so that the frequency of the intermediate frequency signals at the output of the tuner will correspond precisely with the frequency of the pass band provided by the intermediate frequency amplifier in the television receiver.

In order to effect fine tuning, a fine tuning shaft or sleeve 31 is telescopically received over the front end portion of the channel-selector shaft 23. This coaxial arrangement of the shafts 23 and 31 is more or less standard in present television tuners. Within the shaft 31 is a bore **31*a* spaced outwardly from the channel-selector shaft 23. However, the bore 31*a* has a front end portion 31*b* of reduced diameter, so as to make a loose sliding fit with the shaft 23. Thus, the front end of the hollow shaft 31 is rotatably guided by the shaft 23. Adjacent the front end of the hollow shaft 31, the shaft 23 is grooved to receive a C-ring 31*c*, which retains the hollow shaft 31 on the shaft 23**.

The front portion of the channel-selector shaft 23 is rotatably supported in an adjustable bearing 32 which is slidable laterally in an elongated slot 33 formed in a wall 34 at the front of the chassis 13. It will be seen that the slot 33 extends parallel to the direction of movement of the tuning sleeves 14. The illustrated bearing 32 has a nose or bushing portion 35 which extends forwardly through the slot 33, together with a pair of lateral flange portions 36 which engage the rear face of the wall 34. The rear end of the hollow shaft 31 is rotatably supported on a reduced end portion **36*a* at the front end of the bushing element 35. An enlarged bore 36*b* is formed at the rear end of the bore 31*a* to receive the end portion 36*a***

Rotation of the bearing 32 is prevented by means of an arm 37 which extends downwardly from the bushing portion 35 and terminates in a forwardly projecting tongue 38 received in the lower end portion of the slot 33. It will be seen that the flange portions 36 extend downwardly along the full length of the arm 37. A pair of lateral flanges 39 are formed at the front end of the tongue 38 to engage the front face of the wall 34 adjacent the edges of the slot 33 so as to retain the tongue 38 in the slot. A pair of grooves 40 are defined between the opposed flange elements 36 and 39. The portions of the front wall 34 adjacent the edges of the slot 33 are received in the grooves 40.

It will be understood that the slot 33 guides the adjustable bearing 32 for sliding movement along a linear lateral path parallel to the direction of movement of the tuning sleeves 14. Thus the front end portion of the channel-selector shaft 23 is laterally movable to a slight extent. At its rear end, the channel-selector shaft 23 is supported by a fixed bearing 41. Thus the shaft 23 is actually swingable laterally about the pivot point defined by the fixed bearing 41.

To effect actual lateral shifting movement of the channel-selector shaft 23, the fine tuning shaft 31 is fitted with a cam 42 in the form of a disc having a circular peripheral edge 43 which is slightly eccentric with respect to the axis of the channel-selector shaft 23. It will be recalled that the bearing 32 engages the bore **36*b* and thereby supports the hollow shaft 31 for rotation about the axis of the shaft 23. The eccentricity between the bore 36*b* and the eccentric cam surface 43 may be varied according to the extent of desired lateral movement of the main shaft 23**. In one tuner successfully constructed and operated, the eccentricity was .010 of an inch.

To cooperate with the eccentric cam 42, a fixed cam follower 45 is mounted on the front wall 13 of the chassis. It will be seen that the illustrated follower 45 takes the form of a roller which has its opposite ends journaled in a bracket 46 and the chassis wall 34.

The cam 42 is maintained in engagement with the follower roller 45 by means of a spring 48 which biases the adjustable bearing 32 in one direction along the slot 33. The illustrated spring 48 is in the form of a bowed wire acting between the chassis 13 and the movable bearing 32. It will be seen that the bowed midsection of the wire spring 48 is received in a peripheral groove 49 which is formed in the bushing portion 35 of the movable bearing 32. The ends of the bow spring 48 are retained behind lugs 50 struck forwardly from the front wall 34 of the chassis 13. It will be seen that the spring 48 is positioned between the cam disc 42 and the front chassis wall 34.

In order to posititon the main tuning shaft 23 in any of the plurality of predetermined angularly spaced positions corresponding to the various television or radio channels to be covered by the tuner 11, the shaft 23 is provided with a toothed detent wheel 51 which is engaged by a radially movable spring-pressed detent member 52.

It will be seen that the cam disc 42 is formed with a pair of radial shoulders **52*a* at the opposite ends of the eccentric cam surface 33. These shoulders 52*a* cooperate with the roller 45 to limit the extent of rotation of the shaft 31**.

In the operation of the tuner 11, any of the various television channels may be selected by rotating the main tuning shaft 23 and thereby changing the positions of the four cams **24*a*–24*d*. By virtue of the springs 30, the follower members 28 follow the cams 24, with the result that the tuning sleeves 14 are moved longitudinally along the coils 15 as the shaft 23 is rotated. The movement of the tuning sleeves 14 is in a lateral direction relative to the shaft 23. The spring-pressed detent member 52 cooperates with the notched detent wheel 51 to position the shaft 23 in any of its several channel-selecting positons. Because of the detent elements, the positions of the main tuning shaft 23** are predetermined, with the result that precise tuning cannot readily be effected simply by rotating the main shaft.

However, such precise tuning may be accomplished with great convenience and accuracy by rotating the fine tuning shaft 31. When the fine tuning shaft 31 is rotated, the position of the eccentric cam 42 is changed relative to the fixed follower roller 45. The cam 42 is maintained in engagement with the roller 45 by virtue of the wire bow spring 48, which biases the movable bearing 32 in one direction along its guide slot 33. Thus the interaction of the cam 42 and the fixed follower roller 45 is effective to shift the main tuning shaft 23 in a lateral direction as the fine tuning shaft 31 is rotated. Actually, only the front end portion of the main tuning shaft 23 is moved laterally, inasmuch as the rear end of the shaft is supported by the fixed bearing 41. Thus the main tuning shaft 23 is actually swung through a small angle in a lateral plane. As the shaft 23 is moved laterally, the bearing 32 slides along the guide slot 33 in the front plate 34. By virtue of the interaction between the movable bearing and the guide slot, the direction of movement of the shaft 23 is parallel to the direction of movement of the tuning sleeves 14. Accordingly, the lateral movement of the shaft 23 is accompanied by a corresponding slight movement of the tuning sleeves 14.

It will be apparent that the various tuning sleeves 14 of the tuning devices *12a–12d* are moved to different extents by the swinging movement of the shaft 23. The extent of movement of each sleeve 14 is proportional to the distance between the sleeve and the fixed rear bearing 41. Thus the sleeve 14 of the front tuning unit *12d* is moved to the greatest extent, while the other sleeves are moved by lesser amounts. This action is actually highly advantageous, inasmuch as the front tuning unit *12d* controls the operating frequency of the oscillator. It is primarily the oscillator over which fine tuning control is desirable. In addition to effectuating precise fine tuning of the oscillator tuning unit, the exemplary fine tuning mechanism also brings about approximate fine tuning of the antenna and mixer tuning units.

Figures 6–10 illustrate a second exemplary tuner 52 which, in many respects, is similar to the one already described. Thus the tuner 52 includes a chassis or frame 53 which supports a plurality of tuning units *54a–54d*, corresponding generally to the tuning units of the first embodiment. However, in order to illustrate the fact that the present invention is applicable to many types of tuning units, the tuning units 54 are shown in the form of simple moving slug-type tuners, each of which includes a cylindrical tuning slug 55 movable within a coil 56. A tubular form 57 serves to support the coil 56 and guide the slug 55. It will be understood that the slug 5 5may be made of low-loss magnetic material, such as sintered ferrite, or, in the alternative, may simply be made of metal so as to be electrically conductive. Both types of slugs are well known in the art.

As in the case of the first embodiment, the tuner 52 is provided with a tuning or channel-selector shaft 58 supported at its rear end by a fixed bearing 60 which is mounted on the chassis 53. Four cams *61a–61d* are mounted on the shaft 58 to move the slugs 55. Each slug 55 is equipped with an insulating follower member 62 carrying a ball or roller 63 which is engageable with the corresponding cam 61. A spring 64 biases the follower 62 in such a direction as to maintain the ball 63 against the cam. Thus, rotation of the channel-selector shaft 58 causes simultaneous linear sliding movement of the slugs 55 within the coils 56.

Fine tuning is effected by means of a hollow fine tuning shaft or sleeve 65 telescoped over the front end portion of the channel-selector shaft 58. A bore 66 (Figures 8 and 9) is formed in the fine tuning shaft 65 to receive the channel-selector shaft 58. In this case, the fine tuning shaft 65 serves as a movable bearing for the front end portion of the main shaft 58. Thus the fine tuning shaft 65 is rotably received within a slot 67 formed in a wall 68 at the front of the chassis 53. An external groove 69 is formed in the fine tuning shaft 65 to receive the front wall 68 adjacent the edges of the slot 67 so that the fine tuning shaft will be retained in the slot. It will be seen that the bore 66 in the fine tuning shaft is eccentric relative to the cylindrical bottom surface of the groove 69. Thus rotation of the fine tuning shaft 65 is effective to bring about a slight lateral change in the position of the channel-selector shaft 58. Actually, the axis of the channel-selector shaft 58 moves in an orbital path as the fine tuning shaft 65 is rotated.

The fine tuning shaft 65 is maintained against the end of the guide slot 67 by means of a wire bow spring 70 which acts between the front wall 68 of the chassis 53 and the main shaft 58. An annular groove 71 is formed in the shaft 58 to receive the spring 70.

The permissible extent of rotation of the fine tuning shaft 65 is limited by a semi-circular stop plate 72 mounted on the shaft 58. The plate 72 has radial edges 73 and 74 which cooperate with a fixed stop lug 75 struck forwardly from the front plate 68.

As in the first embodiment, the main tuning shaft 58 is resiliently retained in any of several angularly spaced positions, corresponding to the various channels to be covered, by means of the interaction of a notched detent wheel 76, mounted on the shaft 58, and a radially movable spring-pressed detent member 77. Such detent mechanisms are more or less standard in present television tuners.

In the operation of the second embodiment shown in Figures 6–10, the main tuning shaft 58 is rotated to select any of the several television or radio channels covered by the tuner 52. The various positions of the shaft 58 are predetermined by the interaction of the detent wheel 76 and the spring-pressed detent member 77. As the shaft 58 is rotated, the cams *61a–61d* move the respective tuning slugs 55 of the tuning units *54a–54d*. It will be seen that the slugs 55 are moved along parallel paths extending laterally of the shaft 58.

Rotating the fine tuning shaft 65 shifts the lateral position of the shaft 58, inasmuch as the groove 69 in the fine tuning shaft is eccentric relative to the bore 66 which supports the main shaft 58. In other words, the bottom surface of the groove 69 acts as an eccentric cam relative to the bore 66. In this case, the front portion of the main shaft 58 actually moves along a circular orbital path. Actually, only the front end portion of the shaft 58 is moved, while the rear bearing 60 acts as a fixed pivot.

The orbital movement of the shaft 58 results in slight movement of the tuning slugs 55. As in the first embodiment, the extent of movement of each slug 55 is proportional to its distance from the rear bearing 60. Thus it is preferable to employ the front tuning unit *54d* in the oscillator circuit of the tuner 52, so that the greatest extent of fine tuning control will be available over the oscillator. Lesser degrees of fine tuning control are made available over the other tuning units *54a–54c*.

It will be understood that the present invention is applicable to any type of tuner in which the operating frequency may be varied effectively by shifting the main tuning shaft in a lateral direction. While cams are shown to effect lateral movement of the tuning elements in response to rotation of the channel-selector shaft, it will be understood that other general types of tuning mechanisms may be employed in conjunction with the invention.

Various other modifications, alternative constructions, and equivalents may be employed without departing from the true spirit and scope of the invention, as set forth in the foregoing description and defined in the following claims.

I claim:

1. In a radio frequency tuner, the combination comprising a rotatable tuning shaft, a fixed bearing rotatably supporting the rear end portion of said shaft, a rotatable fine tuning sleeve telescopically received over the front end portion of said shaft, a cam mounted on said sleeve and rotatable thereby, a fixed cam follower engaging said cam, and means for biasing said sleeve in one lateral direction and thereby maintaining said cam in engagement with said follower.

2. In a radio frequency tuner, the combination comprising a rotatable tuning shaft, a fixed bearing rotatably supporting said shaft adjacent one end thereof, a plurality of variable radio frequency tuning elements having tuning members movable laterally of said shaft, means operable by rotation of said shaft for moving said tuning members, a fine tuning sleeve telescopically received over said shaft, and means operable by rotation of said fine tuning sleeve for laterally shifting the opposite end of said shaft and thereby effecting fine adjustment of said tuning elements.

3. In a radio frequency tuner, the combination comprising a supporting chassis, a rotatable tuning shaft having first and second end portions, a fixed bearing on said chassis and rotatably supporting said first end portion of said shaft, a plurality of cams spaced longitudinally along and fixed to said shaft, a plurality of variable radio frequency tuning elements having tuning members movable laterally of said shaft and operable by said cams, a fine tuning sleeve telescopically received over said shaft, and means operable by said fine tuning sleeve for shifting the second end portion of said shaft laterally and thereby effecting fine adjustment of said tuning elements.

4. In a radio frequency tuner, the combination comprising a tuning shaft, fixed bearing means rotatably supporting said shaft adjacent one end thereof, a plurality of cams spaced longitudinally along and fixed to said shaft, a plurality of variable radio frequency tuning elements having tuning members movable laterally of said shaft and operable by said cams, a fine tuning sleeve telescopically received over the opposite end portion of said shaft, and eccentric rotary cam means operable by said fine tuning sleeve for laterally shifting the opposite end of said shaft and thereby effecting fine adjustment of said tuning elements.

5. In a radio frequency tuner, the combination comprising a rotatable main tuning shaft, a fixed bearing rotatably supporting the rear end portion of said shaft, a second bearing rotatably supporting the front end portion of said shaft, means supporting said second bearing for lateral sliding movement, a fine tuning sleeve telescopically received over the front end portion of said shaft, a cam mounted on said sleeve and rotatable thereby, a fixed cam follower engaging said cam, and means for biasing said bearing in one lateral direction and thereby maintaining said cam in engagement with said follower, said fine tuning sleeve being rotatable to shift the front end of said shaft laterally and thereby effect a fine tuning adjustment.

6. In a radio frequency tuner, the combination comprising a main tuning shaft, a fixed bearing rotatably supporting the rear end portion of said shaft, a plurality of variable tuning elements spaced longitudinally along said shaft and having respective tuning members movable laterally of said shaft, means operable by said shaft for laterally moving said tuning members, a second bearing rotatably supporting the front end portion of said shaft, means supporting said bearing for lateral sliding movement, a fine tuning sleeve telescopically received over the front end portion of said shaft, a cam mounted on said sleeve and rotatable thereby, a fixed cam follower engaging said cam, and means for biasing said second bearing in one lateral direction and thereby maintaining said cam in engagement with said follower, said fine tuning sleeve being rotatable to shift the front end of said shaft laterally and thereby effect fine adjustment of said tuning elements.

7. In a tuner, the combination comprising a rotatable tuning shaft having front and rear end portions, means forming a bearing rotatably supporting said rear end portion of said shaft, a supporting member having a lateral slot therein with said shaft extending through said slot, a movable bearing slideably received in said slot and rotatably receiving said shaft, a hollow fine tuning shaft telescopically received over said front end portion of said shaft and having a cam mounted thereon, a fixed follower member engaging said cam, and a spring biasing said movable bearing in one direction along said slot and thereby resiliently maintaining engagement between said cam and said follower member, said fine tuning shaft being rotatable to effect lateral shifting movement of said movable bearing and the front end portion of said shaft.

8. In a tuner, the combination comprising a tuning shaft, means forming a bearing rotatably supporting said shaft adjacent one end thereof, a supporting plate extending substantially perpendicular to said shaft and having a slot therein with said shaft extending through said slot, a movable bearing slideably received in said slot and rotatably receiving said shaft adjacent the opposite end thereof, a hollow fine tuning shaft telescopically received over said shaft and having an eccentric cam plate mounted thereon, a fixed follower member mounted on said supporting plate and slideably engaging said cam plate, and a spring acting between said movable bearing and said supporting plate for biasing said movable bearing in one direction along said slot and thereby resiliently maintaining engagement between said cam plate and said follower member, said fine tuning shaft being rotatable to shift said movable bearing and said shaft laterally in the direction of said slot.

9. In a radio frequency tuner, the combination comprising a tuning shaft, a fixed bearing rotatably supporting the rear end portion of said shaft, an adjustable bearing having a bore rotatably receiving the front end portion of said shaft, means rotatably supporting said adjustable bearing for rotation about a predetermined axis, a hollow fine tuning sleeve extending forwardly from said adjustable bearing and telescoped over the front end portion of said shaft, said bore in said adjustable bearing being eccentric relative to said axis of rotation thereof so that rotation of said sleeve will move the front end portion of said shaft laterally and thereby will effect a fine tuning adjustment.

10. In a radio frequency tuner, the combination comprising a main tuning shaft, a fixed bearing rotatably supporting the rear end portion of said shaft, a plurality of variable tuning elements spaced along said shaft and having respective tuning members movable along parallel paths extending laterally of said shaft, a plurality of cam elements mounted on said shaft for simultaneously moving said tuning members, a fine tuning sleeve having a bore therein telescopically receiving the front end portion of said shaft, said fine tuning sleeve having an external cylindrical bearing surface thereon, bearing means in rotatable supporting engagement with said external bearing surface, said bore in said fine tuning sleeve being eccentrically disposed relative to said external bearing surface so that rotation of said sleeve moves the front end portion of said shaft laterally and thereby effects fine adjustment of said tuning elements.

References Cited in the file of this patent

UNITED STATES PATENTS

| | | |
|---|---|---|
| 1,622,783 | Heyman | Mar. 29, 1927 |
| 2,379,284 | Dimmer | June 29, 1945 |
| 2,533,810 | Jacob et al. | Dec. 12, 1950 |
| 2,536,409 | Altman et al. | Jan. 2, 1951 |
| 2,572,964 | Wulfsberg | Oct. 30, 1951 |